(12) United States Patent
Jeong et al.

(10) Patent No.: US 6,666,923 B1
(45) Date of Patent: Dec. 23, 2003

(54) PLASMA POLYMERIZING APPARATUS HAVING AN ELECTRODE WITH A LOT OF UNIFORM EDGES

(75) Inventors: Young-Man Jeong, Kimhae (KR); Su-Won Lee, Changwon (KR); Dong-Sik Youn, Changwon (KR); Sam-Chul Ha, Changwon (KR)

(73) Assignee: LG Electronics Inc. (KR)

( * ) Notice: Subject to any disclaimer, the term of this patent is extended or adjusted under 35 U.S.C. 154(b) by 0 days.

(21) Appl. No.: 09/642,524

(22) Filed: Aug. 18, 2000

(30) Foreign Application Priority Data

Aug. 21, 1999 (KR) .............................. 99-34782

(51) Int. Cl.$^7$ .......................... C23C 16/00; H05H 1/00
(52) U.S. Cl. ................. 118/723; 118/723 AN; 118/718; 156/345.47; 156/345.43
(58) Field of Search ................. 118/723, 729, 118/723 R, 719, 723 AN, 718; 427/434.2; 156/345.47, 345.43

(56) References Cited

U.S. PATENT DOCUMENTS

| | | | | |
|---|---|---|---|---|
| 4,998,968 A | * | 3/1991 | Misumi | 118/723 E |
| 5,652,029 A | * | 7/1997 | Itoh | 427/569 |
| 5,800,618 A | * | 9/1998 | Niori et al. | 118/723 E |
| 5,970,907 A | * | 10/1999 | Takai et al. | 118/723 E |
| 5,972,435 A | * | 10/1999 | Takai et al. | 427/488 |
| 6,001,432 A | * | 12/1999 | Yamazaki et al. | 427/577 |
| 6,050,217 A | * | 4/2000 | Li | 118/723 E |
| 6,055,928 A | * | 5/2000 | Murzin et al. | 118/723 E |
| 6,135,053 A | * | 10/2000 | Okamura | 118/723 E |
| 6,155,201 A | * | 12/2000 | Murayama et al. | 118/723 E |
| 6,167,836 B1 | * | 1/2001 | Taguwa | 118/723 E |

FOREIGN PATENT DOCUMENTS

| | | | | |
|---|---|---|---|---|
| JP | 59-120637 A | * | 7/1984 | ............... C08J/7/10 |
| JP | 5-139883 A | * | 6/1993 | ............ C30B/25/02 |
| JP | 09246259 | | 9/1997 | |
| JP | 09320966 | | 12/1997 | |

OTHER PUBLICATIONS

International Search Report dated Dec. 21, 2000 detailing pertinent pages on related patent copies listed above.

* cited by examiner

Primary Examiner—Parviz Hassanzadeh
(74) Attorney, Agent, or Firm—Ostrolenk, Faber, Gerb & Soffen, LLP

(57) ABSTRACT

The present invention relates to a plasma polymerizing apparatus comprises a polymerizing chamber polymerizing surface of substrates by high voltage discharge, a discharge electrode installed inside of the polymerizing chamber, an opposite electrode having a plurality of uniform edges in order to get electric field be formed uniformly on the surface of the electrode, a high voltage applying unit applying the high voltage to the electrode, a gas providing unit providing monomer gas and non-monomer gas inside of the polymerizing chamber, and a pumping unit keeping vacuum inside of the chamber. The present invention can keep the uniformity of the electrode, accordingly the high quality polymerizing film can be fabricated by keeping the uniformity of the current density, carbonation on the each part of the electrode.

7 Claims, 4 Drawing Sheets

PLASMA POLYMERIZING APPARATUS HAVING AN ELECTRODE WITH A LOT OF UNIFORM EDGES

BACKGROUND OF THE INVENTION

1. Field of the Invention

The present invention relates to a plasma polymerizing apparatus, in particular to a plasma polymerizing apparatus having an electrode with a lot of uniform edges. The apparatus is used in surface treatments of metal, polymer, ceramic etc. and is capable of improving usability of substrates by modifying surfaces of the substrates or forming coating films on the surfaces of the substrates.

2. Description of the Prior Art

In general, when a substrate is surface-treated in plasma discharge, a modified layer having high hardness and abrasion resistance is formed on the surface. There are a lot of surface-modified products such as magnetic disks, optical disks and carbide tools. In addition, when a film coated on the surface of a steel plate is treated in plasma discharge, a hardened coating steel plate having high durability and corrosion resistance can be implemented.

PCT WO99/28530 discloses a plasma polymerizing apparatus, as shown in FIG. 1. The apparatus comprises a vacuum chamber 20, an electrode 4 installed inside of the vacuum chamber 20, vacuum pumps 5, 6 for adjusting pressure of the vacuum chamber 20, gauges 7, 8 for measuring vacuum level, a power supply 40 for applying voltage to the electrode 4, and gas adjusting devices 9, 10 for injecting monomer gas and non-monomer gas such as nitrogen around a substrate 4a to be surfaced-modified.

A substrate 4a, which will be modified by plasma discharge, is placed in the chamber 20. The rotary pump 5 is operated in order to keep inner pressure of the chamber 20 as about $10^{-3}$ Torr, which is confirmed with the thermocouple gauge 7. The diffusion pump 6 is operated in order to keep the inner pressure of the chamber as about $10^{-6}$ Torr, which is confirmed with the ion gauge 8. The substrate 4a is biased as an anode by the power supply 40, whereas the opposite electrode 4 is grounded. After the inner pressure of the chamber is kept as a certain vacuum, monomer gas and non-monomer gas are orderly injected to the chamber 20. When the inner pressure of the chamber reaches a certain level, the chamber is plasma-discharged by direct current or high frequency. At this time, molecular bonding of the gases is cut off in plasma discharge, and a polymerized layer is formed on the surface of the substrate placed between the electrodes by combining cut bondings with actively positive ions and negative ions.

The conventional plasma polymerizing apparatus comprises an plate-shaped electrode, as shown in FIG. 2. Since the plate-shaped electrode has a certain dimension, the current in DC discharge is concentrated on the edges of the electrode. In this case, the gas to be polymerized can be carbonized easily on the edges of the electrode, on the contrary, not easily on the middle portion of the electrode. When the carbonization is varied in accordance with the each portion of the electrode, the voltage applied to the electrode becomes non-uniform, which makes the discharge in the chamber unstable and results in arc discharge. Accordingly, the plasma-polymerized product cannot have a good quality.

In addition, in a case of continually performing plasma polymerizing processing on band-type metals, the size of the electrode increases in order to improve productivity. As the size of the electrode increases, the difference of the current density on the each portion of the electrode becomes larger, and the uniformity of the material to be polymerized, becomes lower.

SUMMARY OF THE INVENTION

It is an object of the present invention to provide an electrode having uniform current density without concentrating of the current density on some parts, which is capable of keeping uniformity and performing high quality plasma deposition in spite of the carbonization.

DETAILED DESCRIPTION OF THE PREFERRED EMBODIMENT

Figure 1:
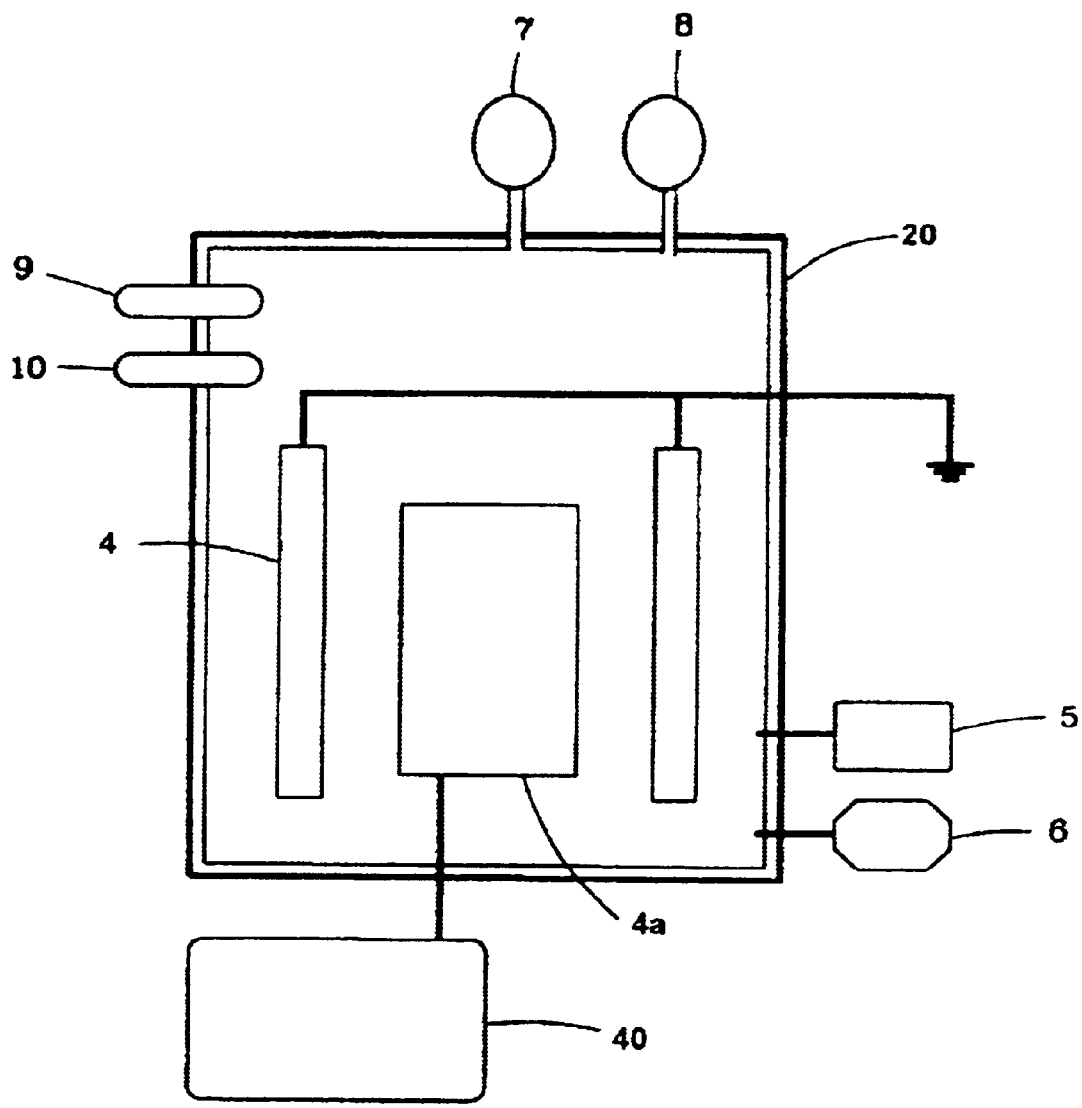
FIG. 1 is a schematic perspective view of the conventional plasma polymerizing apparatus.

The present invention provides a plasma polymerizing apparatus comprising an electrode having a new shape in order to solve above mentioned problems of the conventional plasma polymerizing apparatus.

The plasma polymerizing apparatus of the present invention comprises a polymerizing chamber polymerizing the surface of a substrate by high voltage discharge, a discharge-electrodes installed inside of the polymerizing chamber, an opposite electrode having a plurality of uniform edges in order to get electric field be formed uniformly on the surface of the electrode, a high voltage applying unit applying the high voltage to the electrode, a gas providing unit providing monomer gas and non-monomer gas inside of the polymerizing chamber, and a pumping unit keeping vacuum inside of the chamber.

A plurality of the opposite electrode can be installed inside of the polymerizing chamber. In addition, the electrode may have cutting lines formed on the surface. Herein, the cutting lines can be formed so as to have a certain width. As the preferred embodiment of the opposite electrode, a mesh-shaped electrode can be possible, and it is also possible a plurality of holes having a certain size formed on the surface of the electrode.

A substrate to be polymerized in the polymerizing chamber can be used as a discharge electrode by applying power to it. The plasma polymerizing apparatus of the present invention can further comprises an unwinding chamber having an unwinding roll unwinding substrates, and a winding chamber having a winding roll winding polymerized substrates.

The opposite electrode having a plurality of uniform edges can be used in a continuous plasma polymerizing apparatus. In case of an apparatus using a substrate as one of electrodes, polymerizing efficiency can be improved by installing the electrode opposed to the both surfaces of the substrate.

In the plasma polymerizing by the discharge, the plasma polymerizing occurs not only the polymerized substrate but on the electrodes. When the plasma polymerization continues for a certain time, a polymerizing film formed on the electrode is carbonized. Accordingly, polymerization and carbonization occur repeatedly. Electrodes used in the plasma polymerizing are mainly copper or SUS, and are generally plate-shaped. When a plate-shaped metal is used as an electrode, in applying DC power, the current is concentrated to the edges of the electrode. Accordingly, the carbonization of the polymerizing film on the edges of the electrode can occur easily, but it does not easily on the middle portion. The non-uniformity of the electrode gets the discharge unstable, causes arc discharge to occur in the chamber, and thus makes the quality of the polymerized product lowered.

The present invention can keep the uniformity of the electrode by using the electrode structure formed of a plurality of uniform edges, accordingly can improve quality of the polymerized product by uniforming the current density and the degree of carbonization on the each portion of the electrode.

Hereinafter, the preferred embodiment of the present invention will now be described in detail.

EXAMPLE 1

Figure 2:
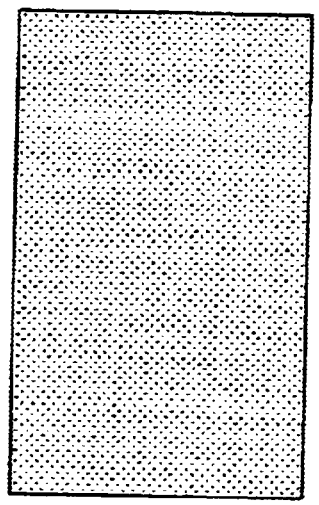
FIG. 2 is a plan view illustrating a plate-shaped electrode used in the conventional apparatus.
Figure 3:
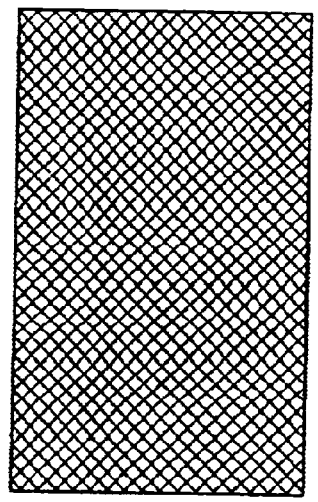
FIG. 3 is a plan view illustrating a mesh-shaped electrode of the present invention.

FIG. 3 illustrates a mesh-shaped electrode as a preferred embodiment of the present invention. In the mesh-shaped electrode, the concentration of the current is lower in comparison to the plate-shaped electrode, as shown in FIG. 2, the current is uniformly distributed on the dimension of the electrode, and the current density is kept uniform. In addition, the quantity of the electrode is required lower than that of the plate-shaped electrode. The size of the mesh is desirably in the range of 2~50 mesh.

Figure 4:
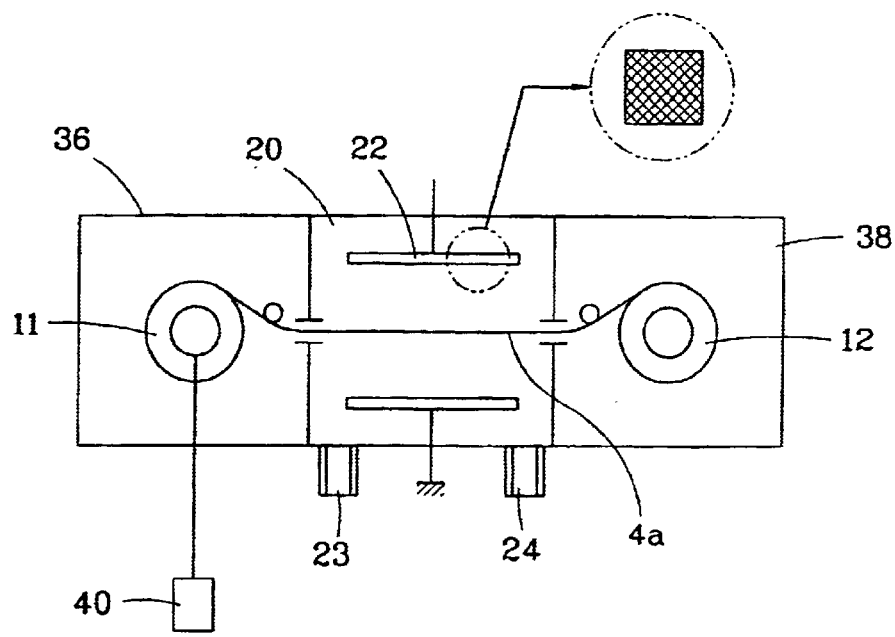
FIG. 4 is a perspective view illustrating a mesh-shaped electrode of the present invention installed on a plasma polymerizing apparatus.

FIG. 4 illustrates a mesh-shaped electrode A of the preferred embodiment of the present invention installed on the plasma polymerizing apparatus. The mesh-shaped electrode of the present invention can be adopted not the plasma polymerizing apparatus which is installed one substrate inside of the chamber and performs depositions but the continuous plasma polymerizing apparatus. In particular, as depicted in FIG. 4, in case of the continuous plasma polymerizing apparatus using the substrate 4a as an electrode, the polymerizing efficiency can be improved by forming the each electrode 22 opposed to the both sides of the substrate so as to be mesh-shaped.

EXAMPLE 2

Figure 5:
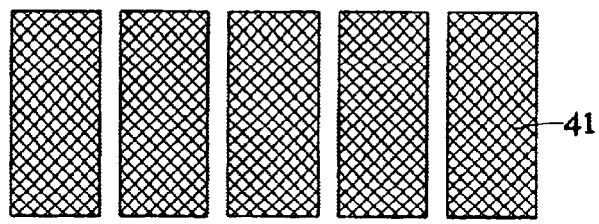
FIG. 5 illustrates a plurality of mesh-shaped electrodes of the preferred embodiment of the present invention.

FIG. 5 illustrates electrodes having a modified structure for the continuous plasma polymerizing apparatus. In order to polymerize continually the substrate having large dimension, the dimension of the electrode has to increase. In this case, it is more desirable dividing the mesh-shaped electrode 41 of the embodiment example 1 into a plurality of the electrodes so as to increase the overall dimension of the electrode. When the dimension of the electrode increase, the current can be concentrated on the edges of the electrode even in the mesh-shaped electrode. In the electrode structure comprising a plurality of electrodes, the variation of the current and voltage can be prevented and a stable plasma can be generated by connecting the power and resistance to the each electrode.

EXAMPLE 3

Figure 6:
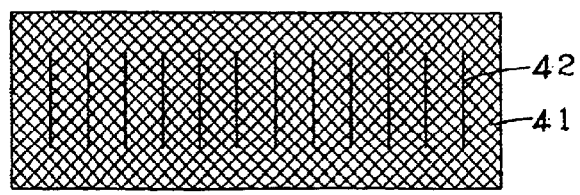
FIG. 6 illustrates a mesh-shaped electrode formed of cutting lines inside of the other preferred embodiment of the present invention.
Figure 7:
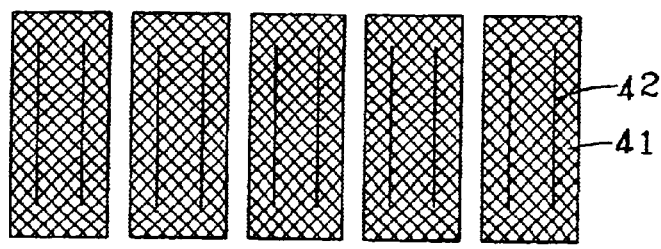
FIG. 7 illustrates a plurality of mesh-shaped electrodes formed of cutting lines inside of the another embodiment of the present invention.

FIG. 6 and FIG. 7 illustrate other embodiments of the present invention. The cutting lines 42 are formed on the mesh-shaped electrode 41 of Example 1 and Example 2. The cutting lines can maximize advantage of the mesh-shaped electrode, accordingly can minimize concentration of the current.

EXAMPLE 4

Figure 8:
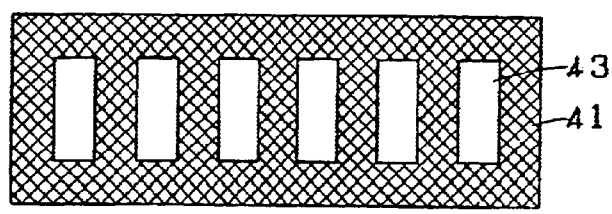
FIG. 8 illustrates a mesh-shaped electrode formed of cutting sections having a certain width of the another embodiment of the present invention.
Figure 9:
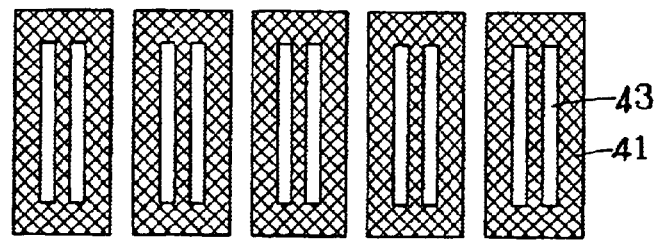
FIG. 9 illustrates a plurality of mesh-shaped electrodes formed of cutting sections having a certain width of the another embodiment of the present invention.

FIG. 8 and FIG. 9 illustrate another embodiments of the present invention. In the mesh-shaped electrode formed of the cutting sections of Example 3, the cutting sections 43 having a certain width is depicted. The structure is more efficient than that of Example 3. Accordingly the concentration of the current is more minimized, and the deposition by the plasma polymerizing can be performed uniformly. In particular, the electrode structure of FIG. 8 is similar with the electrode structure of Example 2, but is implemented as one electrode. Accordingly, there is no need to connect the power to the each electrode, thus the apparatus can be simplified.

The above Examples are the mesh-shaped electrodes, but the electrode of the present invention having a plurality of the uniform edges can be embodied as a structure including a plurality of holes having a certain size, and the present invention may be embodied in several forms without departing from the meets and bounds of the claims.

The mesh-shaped electrode of the present invention can keep the uniformity of the electrode, accordingly it can improve quality of the polymerized product by getting the current density and the carbonization on the each part of the electrode uniformed. In addition, the mesh-shape can be embodied variously and can be adopted all sort of the plasma polymerizing apparatus. In particular, the present invention can keep the uniformity of the electrode when it performs the polymerizing in the continuous plasma polymerizing apparatus for a long time, accordingly the high quality polymerizing film can be fabricated by keeping the uniformity of the electrode.

What is claimed is:

1. A plasma polymerizing apparatus comprising:

a polymerizing chamber for polymerizing the surface of a substrate to be polymerized by high voltage discharge:

a mesh-shaped electrode having a plurality of cutting lines in order to get an electric field to be formed uniformly on the surface of the electrode;

a high voltage applying unit applying a high DC voltage to the mesh-shaped electrode and the substrate as a discharge electrode;

a gas providing unit providing monomer gas and non-monomer gas inside of the polymerizing chamber; and a pumping unit keeping a vacuum state inside of the chamber.

2. The plasma polymerizing apparatus according to claim 1, wherein the plasma polymerizing apparatus further comprises an unwinding chamber having an unwinding roll for unwinding substrates, and a winding chamber having a winding roll for winding the polymerized substrates.

3. The plasma polymerizing apparatus according to claim 1, the cutting lines having a certain width.

4. A plasma polymerizing apparatus, comprising:
- a polymerizing chamber for polymerizing the surface of a substrate to be polymerized by a high voltage discharge;
- a mesh-shaped electrode comprised of a plurality of smaller sized mesh-shaped electrodes arranged to have certain width spacings between each other in the polymerizing chamber in order to obtain an electric field that is formed uniformly on the surface of the electrode;
- a high voltage applying unit for applying a high DC voltage to the mesh-shaped electrodes and the substrate as a discharge electrode;
- a gas providing unit for providing a monomer gas and a non-monomer gas inside of the polymerizing chamber; and
- a pumping unit keeping a vacuum state inside of the chamber, wherein each of the smaller sized mesh-shaped electrodes has a narrow and long sheet shape with the length of the sheet being larger than the width thereof.

5. The plasma polymerizing apparatus according to claim 4, wherein a plurality of cutting lines are formed on the surfaces of the mesh-shaped electrodes.

6. The plasma polymerizing apparatus according to claim 5, herein the cutting lines have a certain width.

7. The plasma polymerizing apparatus according to claim 4, wherein the plasma polymerizing apparatus further comprises an unwinding chamber having an unwinding roll for unwinding substrates, and a winding chamber having a winding roll for winding the polymerized substrates.

* * * * *